(12) United States Patent
Nagai et al.

(10) Patent No.: US 11,693,250 B2
(45) Date of Patent: Jul. 4, 2023

(54) LASER BEAM COMBINING DEVICE

(71) Applicant: KAWASAKI JUKOGYO KABUSHIKI KAISHA, Kobe (JP)

(72) Inventors: Toru Nagai, Kakamigahara (JP); Ryuji Nagaoka, Kakamigahara (JP)

(73) Assignee: KAWASAKI JUKOGYO KABUSHIKI KAISHA, Kobe (JP)

(*) Notice: Subject to any disclaimer, the term of this patent is extended or adjusted under 35 U.S.C. 154(b) by 615 days.

(21) Appl. No.: 16/776,532

(22) Filed: Jan. 30, 2020

(65) Prior Publication Data

US 2020/0166763 A1 May 28, 2020

Related U.S. Application Data

(63) Continuation of application No. PCT/JP2018/029133, filed on Aug. 2, 2018.

(30) Foreign Application Priority Data

Aug. 3, 2017 (JP) ................................. 2017-150994

(51) Int. Cl.
*G02B 27/10* (2006.01)
*G02B 5/00* (2006.01)
(Continued)

(52) U.S. Cl.
CPC ......... *G02B 27/1006* (2013.01); *G02B 5/001* (2013.01); *G02B 5/10* (2013.01);
(Continued)

(58) Field of Classification Search
CPC ...... G02B 27/1006; G02B 5/001; G02B 5/10; G02B 5/1861; G02B 5/1866;
(Continued)

(56) References Cited

U.S. PATENT DOCUMENTS

2003/0021032 A1* 1/2003 Bamji ................... G06F 3/0421
359/558
2007/0098324 A1 5/2007 Kitamura et al.
(Continued)

FOREIGN PATENT DOCUMENTS

EP 3 064 986 A1 9/2016
JP 2007-121899 A 5/2007
(Continued)

OTHER PUBLICATIONS

Examiner provided machine translation of Toru, WO 2015064017 (Year: 2015).*

*Primary Examiner* — Balram T Parbadia
*Assistant Examiner* — Gabriel A Sanz
(74) *Attorney, Agent, or Firm* — Xsensus LLP

(57) ABSTRACT

A laser beam combining device includes an emission optical system that emits a plurality of circular laser beams propagated coaxially and having mutually different wavelengths, and a diffractive optical element that is concentric and diffracts the plurality of circular laser beams. The diffractive optical element diffracts the plurality of circular laser beams in accordance with the wavelengths of the circular laser
(Continued)

beams, such that local diffraction angles of diffracted light of the plurality of circular laser beams incident at mutually different local incidence angles are equal to each other.

14 Claims, 7 Drawing Sheets

(51) Int. Cl.
    *G02B 5/10*          (2006.01)
    *G02B 5/18*          (2006.01)
    *G02B 19/00*        (2006.01)
    *G02B 27/14*        (2006.01)
    *H01S 5/40*         (2006.01)

(52) U.S. Cl.
    CPC .......... *G02B 5/1861* (2013.01); *G02B 5/1866* (2013.01); *G02B 19/0009* (2013.01); *G02B 19/0057* (2013.01); *G02B 27/141* (2013.01); *G02B 27/145* (2013.01); *H01S 5/4012* (2013.01)

(58) Field of Classification Search
    CPC ............ G02B 19/0009; G02B 19/0057; G02B 27/141; G02B 27/145; G02B 27/0905; G02B 27/0056; G02B 27/1086; G02B 5/18; G02B 13/00; G02B 13/18; G02B 27/10; G02B 27/14; G02B 27/40; G02B 27/42; H01S 5/4012; B23K 26/0608; B23K 26/064
    See application file for complete search history.

(56) References Cited

U.S. PATENT DOCUMENTS

| | | | | |
|---|---|---|---|---|
| 2014/0307750 | A1* | 10/2014 | Kono | H01S 5/0657 372/18 |
| 2015/0085891 | A1* | 3/2015 | Watanabe | H01S 5/323 372/50.11 |
| 2016/0161752 | A1* | 6/2016 | Negoita | H01S 5/4062 359/569 |
| 2017/0235151 | A1* | 8/2017 | Kim | G02B 27/106 359/572 |

FOREIGN PATENT DOCUMENTS

| | | |
|---|---|---|
| JP | 2016-075786 A | 5/2016 |
| JP | 2016-076520 A | 5/2016 |
| JP | 2016-112609 A | 6/2016 |

\* cited by examiner

LASER BEAM COMBINING DEVICE

CROSS-REFERENCES TO RELATED APPLICATIONS

The present application is a bypass continuation of PCT filing PCT/JP2018/029133, filed Aug. 2, 2018, which claims priority to JP 2017-150994, filed Aug. 3, 2017, both of which are incorporated herein by reference.

TECHNICAL FIELD

The present invention relates to a laser beam combining device, and particularly to a laser beam combining device that combines a plurality of circular laser beams.

BACKGROUND ART

Conventionally known as a device that combines a plurality of circular laser beams, for example, is a laser beam combining device. In this laser beam combining device, a shaping optical unit concentrically emits a plurality of circular laser beams having mutually different increments in outer diameter dimensions per unit propagation distance. These circular laser beams are reflected by a secondary mirror of a condensing optical system, overlapped by a primary mirror, and then condensed.

SUMMARY

A laser beam combining device includes an emission optical system that emits a plurality of circular laser beams propagated coaxially and having mutually different wavelengths, and a diffractive optical element that is concentric and diffracts the plurality of circular laser beams, in which the diffractive optical element diffracts the plurality of circular laser beams in accordance with the wavelengths of the circular laser beams, such that local diffraction angles of diffracted light of the plurality of circular laser beams incident at mutually different local incidence angles are equal to each other.

In this configuration, since focal positions of the diffracted light of the plurality of circular laser beams can be matched, an irradiation power density of a synthetic laser beam obtained by combining the diffracted light can be enhanced.

In the laser beam combining device, the diffractive optical element may be disposed at a position in which the plurality of circular laser beams overlap each other. In this configuration, the irradiation power density of the synthetic laser beam obtained by combining the diffracted light can be enhanced by overlapping the diffracted light of the plurality of circular laser beams with each other.

In the laser beam combining device, the diffractive optical element may have an incidence surface or an emission surface on which a plurality of annular regions that are concentric and divided by a plurality of steps are formed. In this configuration, when the plurality of annular regions are formed on the incidence surface of the diffractive optical element, the local diffraction angles of the diffracted light of the circular laser beam reflected and diffracted by the incidence surface can be matched. Further, when the plurality of annular regions are formed on the emission surface of the diffractive optical element, the local diffraction angles of the diffracted light of the circular laser beam that is transmitted and diffracted by the emission surface can be matched.

In the laser beam combining device, when the diffractive optical element is reflective, an equation: $m \cdot \lambda n = 2d \cdot \sin[(\alpha n - \alpha c)/2 + \theta bl] \cdot \cos[(\alpha n + \alpha c)/2 - \theta bl]$ is satisfied, where $\lambda n$ represents each of the wavelengths of the plurality of circular laser beams, $\alpha n$ represents a local incidence angle of the plurality of circular laser beams to the diffractive optical element, d represents a distance dimension of each of the plurality of annular regions of the diffractive optical element, $\theta bl$ represents a blaze angle that is an inclination of each of the annular regions, m represents a diffraction order, n represents a natural number allocated for each of the circular laser beams (n=1, 2, ... N), N represents a number of the circular laser beams emitted from the emission optical system, and c represents an n-value of a representative of the circular laser beams and is any value of (n=1, 2, ... N). In this configuration, the plurality of circular laser beams can be diffracted in accordance with the wavelengths of the plurality of circular laser beams, such that the local diffraction angles of the diffracted light of the plurality of circular laser beams incident at mutually different local incidence angles are equal to each other.

The laser beam combining device may further include a condensing optical system that condenses the diffracted light of the plurality of circular laser beams, and a magnifying optical system that magnifies the diffracted light of the plurality of circular laser beams between the diffractive optical element and the condensing optical system. In this configuration, since the diffracted light of the circular laser beam is magnified by the magnifying optical system and then condensed by the condensing optical system, light condensing performance of the diffracted light is improved, and the irradiation power density of the synthetic laser beam is enhanced.

DESCRIPTION OF EMBODIMENTS

Figure 1:
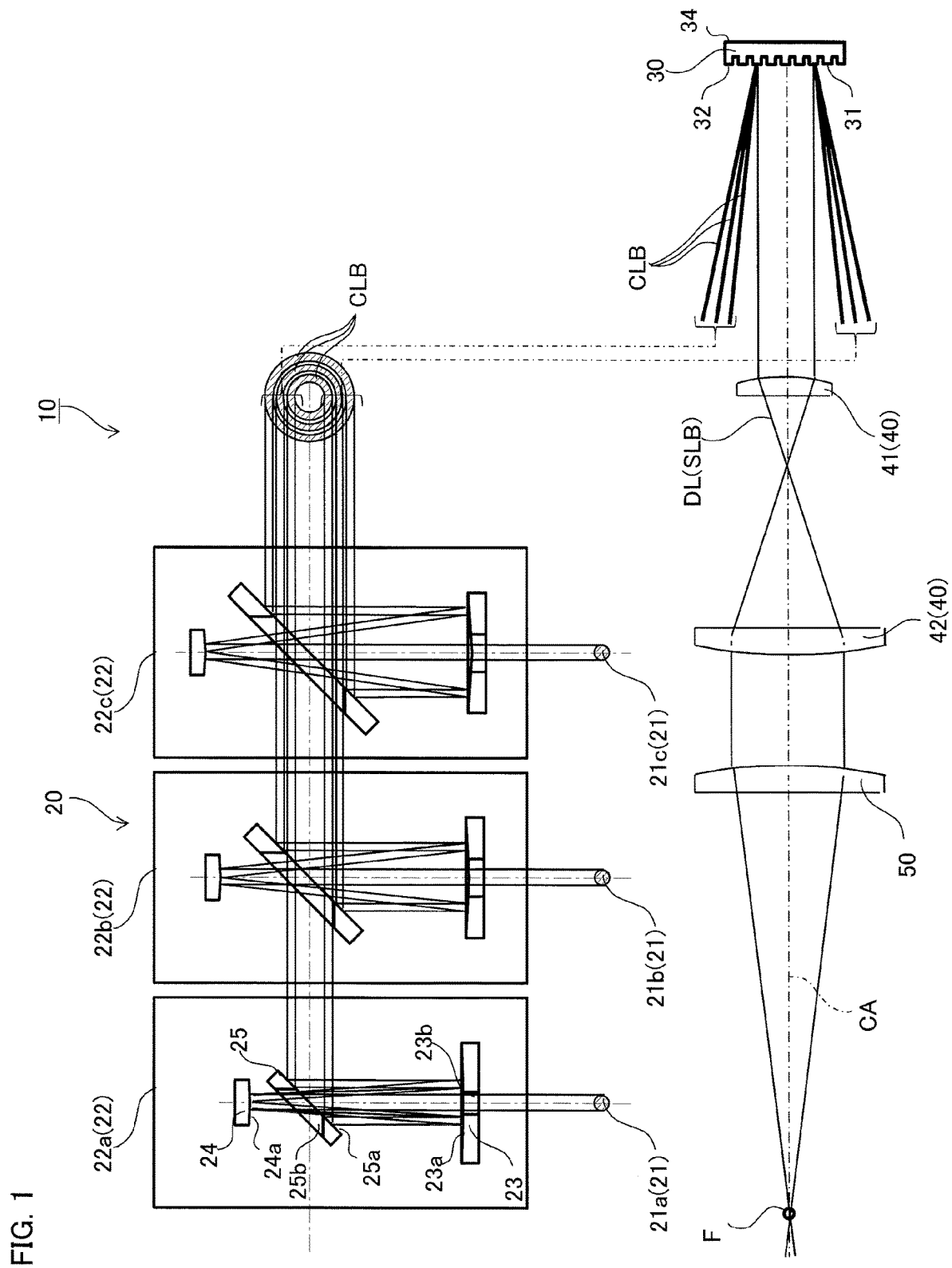
FIG. 1 is a configuration diagram schematically showing a laser beam combining device according to an embodiment of the present invention.

Embodiments of the present invention will now be described with reference to the drawings. In the following description, the same or corresponding elements are denoted by the same reference signs throughout all the drawings, and redundant description thereof is omitted.

Embodiments (Configuration of Laser Beam Combining Device)

A configuration of a laser beam combining device 10 will be described with reference to FIG. 1. The laser beam combining device 10 is a device that combines a plurality of circular laser beams CLB into one synthetic laser beam CL. The laser beam combining device 10 includes an emission optical system 20, a diffractive optical element 30, a magnifying optical system 40, and a condensing optical system 50. The emission optical system 20 is an optical system that emits the plurality of circular laser beams CLB coaxially propagated and having mutually different wavelengths, the emission optical system including a plurality of laser light sources 21 and a plurality of shaping optical units (hereinafter referred to as "units 22").

The laser light source 21 is a laser device that emits a solid laser beam having a circular cross section, and a semiconductor laser, a fiber laser, a solid laser, or the like is used according to preferred characteristics. The plurality of (for example, three) laser light sources 21 (a first laser light source 21*a*, a second laser light source 21*b*, and a third laser light source 21*c*) are disposed, such that optical axes of the emitted solid laser beams are parallel to each other. The three solid laser beams have mutually different wavelengths. The third laser light source 21*c*, the second laser light source 21*b*, and the first laser light source 21*a* are arranged in that order from the side near the diffractive optical element 30.

The unit 22 emits the circular laser beams CLB having mutually different decrements in outer diameter dimensions per unit propagation distance. The plurality of (for example, three) units 22 (a first unit 22*a*, a second unit 22*b*, and a third unit 22*c*) are disposed corresponding to the laser light sources 21 (the first laser light source 21*a*, the second laser light source 21*b*, and the third laser light source 21*c*). The three units 22 are arranged in an older of the third unit 22*c*, the second unit 22*b*, and the first unit 22*a* from the side near the diffractive optical element 30. The circular laser beam CLB is a ring-shaped laser beam from which a central portion of the laser beam having a circular cross section is removed.

The unit 22 includes a pair of axicon mirrors 23 and 24 and a scraper mirror or 25. The pair of axicon mirrors 23 and 24 includes a concave axicon mirror 23 and a convex axicon mirror 24, and the concave axicon mirror 23 is located closer to the laser light source 21 than the convex axicon mirror 24 is.

The convex axicon mirror 24 is disposed, such that a first reflective surface 24*a* faces the laser light source 21. The first reflective surface 24*a* protrudes in a conical shape, converts the incident solid laser beam into the circular laser beam CLB, and emits the circular laser beam CLB so as to increase the outer diameter dimension of the circular laser beam CLB. Note that a cone angle of the first reflective surface 24*a* will be described later.

The concave axicon mirror 23 has a second reflective surface 23*a* and a hole (first passage hole) 23*b*. The second reflective surface 23*a* is recessed in a conical shape, and emits the circular laser beam CLB emitted from the convex axicon mirror 24, with a reduced inner diameter dimension and a reduced outer diameter dimension. The first passage hole 23*b* passes through the second reflective surface 23*a* and a surface opposite to the second reflective surface 23*a* along a cone axis of the second reflective surface 23*a* at an apex of the cone of the second reflective surface 23*a* The concave axicon mirror 23 is disposed, such that the first passage hole 23*b* is along the optical axis of the solid laser beam from the laser light source 21 and the second reflective surface 23*a* faces the first reflective surface 24*a*. Note that a cone angle of the second reflective surface 23*a* will be described later.

The scraper mirror 25 is a reflection optical system that changes a path of the circular laser beam CLB emitted from the concave axicon mirror 23. The scraper mirror 25 is disposed between the concave axicon mirror 23 and the convex axicon mirror 24 so as to be inclined at 45° with respect to the optical axis of the laser light source 21. A third reflective surface 25*a* of the scraper mirror 25 is flat, and a hole (second passage hole) 25*b* is provided at a center of the third reflective surface 25*a* The second passage hole 25*b* passes through the scraper mirror 25 from two directions inclined at 45° with respect to the third reflective surface 25*a*, such that two laser beams orthogonal to each other can pass through the second passage hole 25*b*. One of these two directions is parallel to the optical axis of the laser light source 21. The three scraper mirrors 25 are disposed, such that the three circular laser beams CLB reflected by the respective third reflective surfaces 25*a* of the three scraper mirrors 25 are coaxial with each other.

Figure 4:
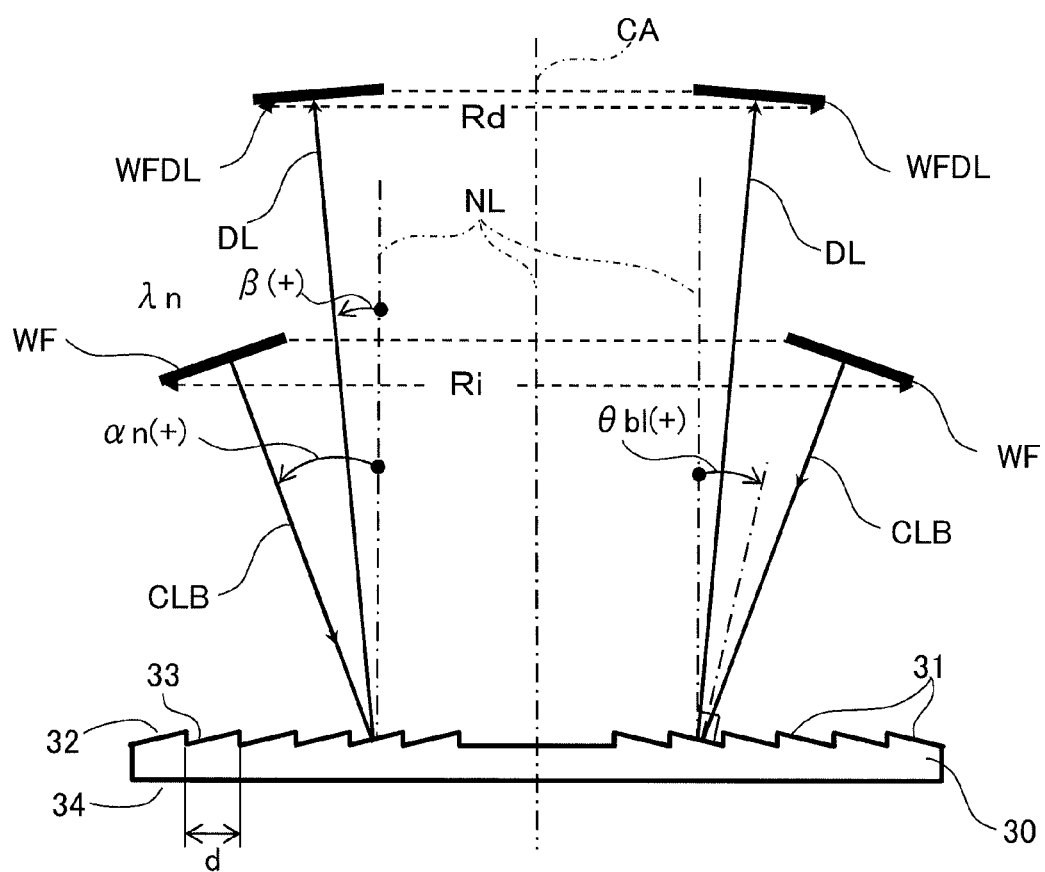
FIG. 4 is a diagram schematically showing a circular laser beam and diffracted light of the circular laser beam in the diffractive optical element of FIG. 3A.

The diffractive optical element 30 is disposed at a position where the plurality of circular laser beams CLB emitted from the emission optical system 20 overlaps each other. Further, convergence angles of the plurality of circular laser beams CLB are different from each other. In this case, local incidence angles of the plurality of circular laser beams CLB incident on the diffractive optical element 30 are also different from each other. As shown in FIG. 4, the local incidence angle is an incidence angle in a wavefront traveling direction when focus is locally placed on a radial cross section of a wavefront WF of the asymmetric circular laser beam CLB, and is equal to the convergence angle of the circular laser beam CLB incident on the diffractive optical element 30.

The diffractive optical element 30 diffracts the plurality of circular laser beams CLB, such that local diffraction angles of the diffracted light DL of the plurality of circular laser beams CLB incident at mutually different local incidence angles are equal to each other. As shown in FIG. 4, the local diffraction angle is a diffraction angle in the wavefront traveling direction when focus is locally placed on a radial cross section of a wavefront WFDL of the axisymmetric diffracted light DL, and is equal to a divergence angle of the diffracted light DL emitted from the diffractive optical element 30. By such diffraction, as shown in FIG. 1, the plurality of beams of diffracted light DL emitted from the diffractive optical element 30 have the same local diffraction angle, and one beam of diffracted light DL is combined to produce a synthetic laser beam SLB. The diffractive optical element 30 will be described later.

The magnifying optical system 40 is provided between the diffractive optical element 30 and the condensing optical system 50, and increases an outer diameter dimension of the diffracted light DL (that is, the synthetic laser beam SLB) of the plurality of circular laser beams CLB diffracted by the diffractive optical element 30. A radial width (half of a difference between the outer diameter dimension and the inner diameter dimension) of the synthetic laser beam SLB is also increased. The magnifying optical system 40 includes, for example, two plano-convex lenses (an incident side plano-convex lens 41 and an emission side plano-convex lens 42). However, the magnifying optical system 40 is not limited to this configuration, and alternatively, a combination of a concave lens and a convex lens, a combination of a convex mirror and a concave mirror, a combination of a concave mirror and a concave mirror, or the like can be used.

The condensing optical system 50 is an optical system that condenses the diffracted light DL (that is, the synthetic laser beam SLB) of the plurality of circular laser beams CLB emitted from the diffractive optical element 30, and uses, for example, the plano-convex lens. However, the condensing optical system 50 is not limited to the plano-convex lens, and may be configured by a biconvex lens, a concave-convex lens (meniscus lens), a concave mirror, and the like.

The laser beam combining device 10 may include a reduction optical system, alight guide optical system, and the like between the unit 22 and the condensing optical system 50. The reduction optical system is an optical system that reduces the diameter dimension of the circular laser beam CLB emitted from the unit 22. The light guide optical system is an optical system that guides the circular laser beam CLB emitted from the unit 22 to the condensing optical system 50.

(Angle of Axicon Mirror)

Figure 2A:
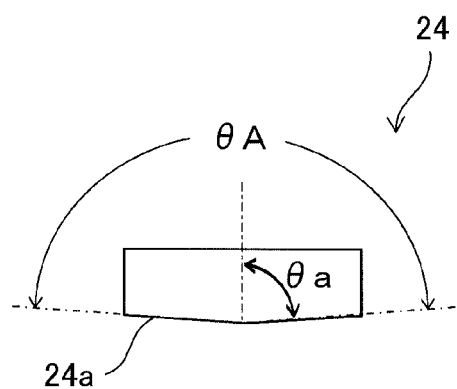
FIG. 2A is a diagram showing a cone angle $\theta A$ of a first reflective surface of a convex axicon mirror of FIG. 1.
Figure 2B:
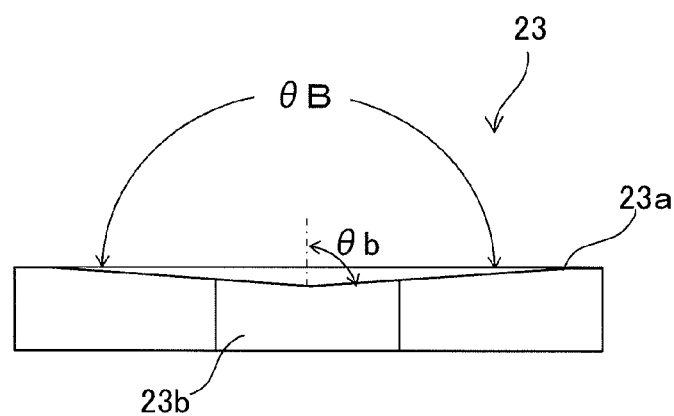
FIG. 2B is a diagram showing a cone angle $\theta B$ of a second reflective surface of a concave axicon mirror of FIG. 1.

As shown in FIGS. 2A and 2B, a cone angle θA of the first reflective surface 24a of the convex axicon mirror 24 is twice an angle θa between a rotary axis and a generating line of the cone on the first reflective surface 24a. The cone angle θA is represented by θA=(180−α)+Δ. Further, a cone angle θB of the second reflective surface 23a of the concave axicon mirror 23 is twice an angle θb between a rotary axis and a generating line of the cone on the second reflective surface 23a. The cone angle θB is represented by θB=(180−α). Here, α is 1 degree or more and 10 degrees or less. Further, Δ is 0.1 degrees or more and 0.1 degrees or less, and is larger as the convex axicon mirror is closer to the diffractive optical element 30.

Thus, in each unit 22, the cone angle of the first reflective surface 24a and the cone angle of the second reflective surface 23a are different, and the difference is larger as the pair of axicon mirrors 23 and 24 is closer to the diffractive optical element 30. Thus, the plurality of circular laser beams CLB emitted from the plurality of units 22 are emitted with mutually different diameters and at mutually different divergence angles, and then overlap each other as they are propagated.

(Configuration of Diffractive Optical Element)

Figure 3A:
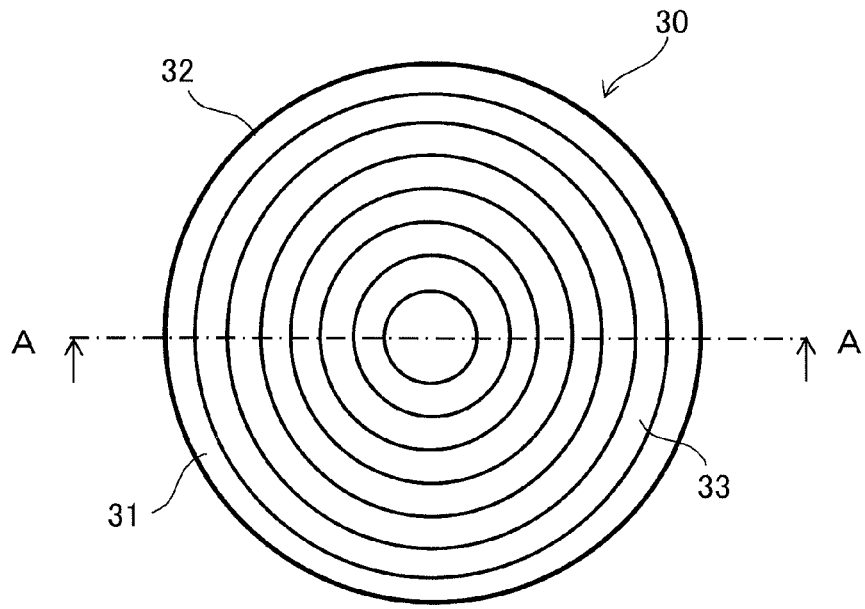
FIG. 3A is a diagram showing a reflective surface of a diffractive optical element of FIG. 1.

As shown in FIG. 3A, the diffractive optical element 30 has a reflective surface (incidence surface) 32 in which a plurality of annular regions 31 that are concentric and divided by a plurality of steps are formed. For example, the diffractive optical element 30 has a disk shape, and a plurality of grooves 33 is provided on the reflective surface 32. The steps are formed on the reflective surface 32 by the grooves 33, and the reflective surface 32 is divided into the plurality of annular regions 31 by the steps.

The grooves 33 are annular. The plurality of grooves 33 are disposed at equal intervals such that centers of the grooves coincide with each other, and are formed such that radial dimensions (differences between outer diameter dimensions and inner diameter dimensions) of the annular regions 31 coincide with each other.

Figure 3B:
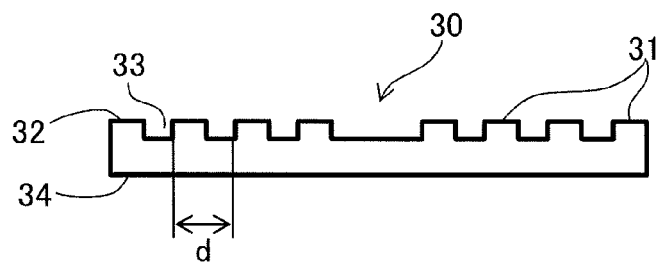
FIGS. 3B to 3D are cross-sectional views of the diffractive optical element taken along line A-A in FIG. 3A.

As shown in FIG. 3B, each of the annular regions 31 between the adjacent grooves 33 may have a rectangular cross section obtained by cutting the diffractive optical element 30 in the radial direction. In this case, the groove 33 is provided between the adjacent annular regions 31. The annular regions 31 are formed so as to be flush with each other and orthogonal to a normal line of the diffractive optical element 30.

Figure 3C:
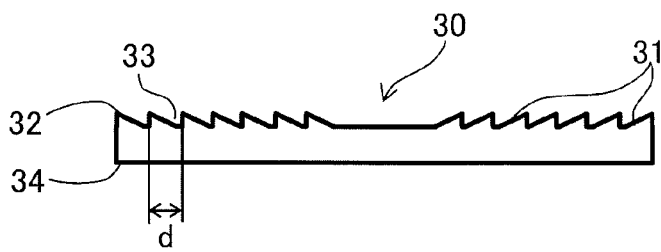
Figure 3D:
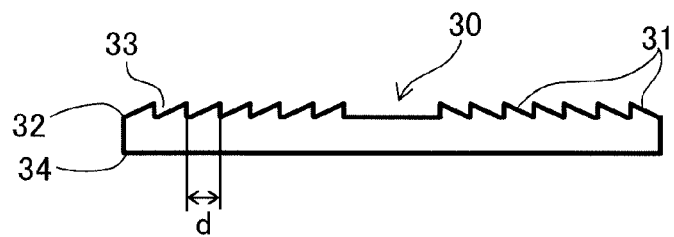

Further, as shown in FIGS. 3C and 3D, each of the annular regions 31 formed by the groove 33 may have a sawtooth-shape cross section obtained by cutting the diffractive optical element 30 in the radial direction. In this case, the adjacent annular regions 31 are disposed so as to continue to each other when viewed from a direction of the normal line of the diffractive optical element 30.

In each of the annular regions 31 shown in FIG. 3C, the reflective surface 32 is inclined within a section d so as to be higher as being away from a center of the diffractive optical element 30 (that is, such that the reflected beam protrudes by a larger distance in a traveling direction of the reflected beam). Further, in the annular regions 31, portions located on the same radius from the center to an outer edge of the diffractive optical element 30 are formed so as to be parallel to each other and have the same height.

Further, in each of the annular regions 31 illustrated in FIG. 3D, the reflective surface 32 is inclined within a section d so as to be lower as being away from the center of the diffractive optical element 30 (that is, such that the reflected beam protrudes by a smaller distance in the traveling direction of the reflected beam). Further, in the annular regions 31, portions located on the same radius from the center to an outer edge of the diffractive optical element 30 are formed so as to be parallel to each other and have the same height.

(Diffraction of Diffractive Optical Element)

In a reflective diffractive optical element shown in FIG. 4, when the circular laser beam CLB having a wavelength (center wavelength) of an is incident on the diffractive optical element 30 at a local incidence angle αn, the diffracted light DL having a diffraction order m is diffracted at a local diffraction angle β, the circular laser beam CLB being emitted from the n-th emission optical system 20 in reverse order of proximity to the diffractive optical element 30 (n is a natural number (n=1, 2, . . . N), N being a number of circular laser beams emitted from the emission optical system). Here, a thick line with a reference sign CLB in FIG. 4 imitates the wavefront WF of the incident circular laser beam CLB, and a thick line with a reference sign DL in FIG. 4 imitates the wavefront WFDL of the diffracted light DL.

The local incidence angle αn is an angle between a normal line of one of two portions of the wavefront WF and a normal line NL of the diffractive optical element 30 in a cross section (radial cross section) in which the wavefront WF passes through a central axis CA of the circular laser beam CLB having a truncated conical shape. The wavefront WF having a truncated conical shape of the circular laser beam CLB is asymmetric with respect to the central axis CA, and the central axis CA is the normal line NL of the diffractive optical element 30. The incidence angle of the circular laser beam CLB itself is therefore 0.

The circular laser beam CLB is propagated at a convergence angle αn and is incident on the diffractive optical element 30 at the local incidence angle αn. Therefore, the local incidence angle αn is synonymous with the convergence angle of the circular laser beam CLB incident on the diffractive optical element 30. The convergence angle is a half angle of the angle of the cone (vertical angle) when the circular laser beam CLB is propagated with a spot size of the circular laser beam CLB (outer diameter dimension Ri of the wavefront WF) narrowed into a conical shape toward the traveling direction.

The convergence angle of the circular laser beam CLB is represented by + (plus) when the spot size decreases (converges) toward the traveling direction, by − (minus) when the spot size increases (diverges), and by 0 (zero) when the spot size does not change. When the spot size of the circular laser beam CLB increases toward the traveling direction, the convergence angle of the circular laser beam CLB is also represented as a divergence angle. For this reason, the convergence angle (divergence angle, local incidence angle) $\alpha n$ of the diverging circular laser beam CLB has a negative (minus) value, and the convergence angle (local incidence angle) $\alpha n$ of the converging circular laser beam CLB has a positive (plus) value. In FIG. 4, a direction of an anew $\alpha n$ from the normal line NL of the diffractive optical element 30 represents a + (positive) direction of $\alpha n$.

Further, the local diffraction angle $\beta$ is an angle between a normal line of one of two portions of the wavefront WFDL and the normal line NL of the diffractive optical element 30 in a cross section (radial cross section) in which the wavefront WFDL passes through the central axis CA of the diffracted light DL having a truncated conical shape. The wavefront WFDL having a truncated conical shape of the diffracted light DL is axisymmetric with the central axis CA, and the central axis CA is the normal line NL of the diffractive optical element 30. The diffraction angle of the diffracted light DL itself is therefore 0.

The diffracted light DL is diffracted by the diffractive optical element 30 at the local diffraction angle $\beta$, and is emitted from the diffractive optical element 30 and propagated at the divergence angle $\beta$. Thus, the local diffraction angle $\beta$ is synonymous with the divergence angle of the diffracted light DL emitted from the diffractive optical element 30. This divergence angle is a half angle of the angle of the cone (vertical angle) when the diffracted light DL is propagated with a spot size of the diffracted light DL (outer diameter dimension Rd of the wavefront WFDL) expanded in a conical shape toward the traveling direction.

The divergence angle of the diffracted light DL is represented by + (plus) when the spot size increases (diverges) toward the traveling direction, by − (minus) when the spot size decreases (converges), and by 0 (zero) when the spot size does not change. When the spot size of the diffracted light DL is reduced toward the traveling direction, the divergence angle of the diffracted light DL can be expressed as a convergence angle. Thus, the divergence angle (local diffraction angle) $\beta$ of the diverging diffracted light DL has a positive (plus) value, and the divergence angle (convergence angle, local diffraction angle) $\beta$ of the converging diffracted light DL has a negative (minus) value. Further, in FIG. 4, a direction of an arrow of $\beta$ from the normal line NL of the diffractive optical element 30 represents a + (positive) direction of $\beta$.

In this case, the diffraction grating equation is represented by the following equation (1). Here, d is a radial distance dimension between the adjacent annular regions 31 of the diffractive optical element 30.

$$d(\sin \alpha n + \sin \beta) = m \cdot \lambda n \quad (1)$$

When the circular laser beam CLB of the incident light and the m-th order diffracted light DL are a specular reflection of each other in the annular region 31 on the reflective surface 32 of the diffractive optical element 30, most energy focuses on the m-th older diffracted light DL. When a representative (or center) wavelength is selected from the wavelengths (center wavelengths) $\lambda n$ emitted from the emission optical system 20 and is set to $\lambda c$ (n=c), the inclination (blaze angle) $\theta bl$ of the annular region 31 is represented by the following equation (2).

Note that m is a diffraction order, and c is an n-value of a representative of the circular laser beams CLB, which is any value of (n=1, 2, . . . N). While n is a variable, c is a constant. For example, the median from among (n=1, 2, . . . N) is selected for c. When N is an odd number, c=(1+N)/2, and when N is an even number, c=N/2 or N/2+1.

Further, in FIG. 4, a direction of an arrow of $\theta bl$ from the normal line NL of the diffractive optical element 30 represents a + (positive) direction of $\theta bl$.

$$\theta bl = (\alpha c + \beta)/2 \quad (2)$$

A wavelength $\lambda n$ when high diffraction efficiency is obtained for m-th order diffracted light DL is represented by the following equation (3) from the above equations (1) and (2).

$$m \cdot \lambda n = d(\sin \alpha n + \sin \beta) = 2d \sin [(\alpha n - \alpha c)/2 + \theta bl] \cdot \cos [(\alpha n + \alpha c)/2 - \theta bl] \quad (3)$$

As shown in the above equation (3), when the distance dimension d of the adjacent annular regions 31 of the diffractive optical element 30 is constant, the wavelengths $\lambda n$ of the plurality of circular laser beams CLB incident on the diffractive optical element 30 depend on the local incidence angle $\alpha n$ and the local diffraction angle $\beta$. Therefore, the plurality of circular laser beams CLB having mutually different local incidence angles $\alpha n$ with respect to the diffractive optical element 30 can be diffracted in accordance with the wavelength $\lambda n$, such that the local diffraction angles $\beta$ of the diffracted light DL coincide with each other. That is, when the diffractive optical element 30 having the above-described dimension d and the blaze angle $\theta bl$ is used, the diffracted light DL having the same local diffraction angle $\beta$ can be obtained from the circular laser beam CLB (n: natural number) having the wavelength $\lambda n$ and the local incidence angle $\alpha n$.

(Operation of Laser Beam Combining Device)

As shown in FIG. 1, the solid laser beam having the wavelength $\lambda n$ is incident on an n-th unit 22 from an n-th (n is a natural number) laser light source 21 in reverse order of proximity to the diffractive optical element 30. In the n-th unit 22, the solid laser beam passes through the first passage hole 23b of the concave axicon mirror 23, and further passes through the second passage hole 25b of the scraper mirror 25.

Then, the solid laser beam passes through the first passage hole 23b of the concave axicon mirror 23, and is converted into the circular laser beam CLB by the first reflective surface 24a in a conical shape of the convex axicon mirror 24. The circular laser beam CLB passes through the second passage hole 25b of the scraper mirror 25 and is reflected by the second reflective surface 23a of the concave axicon mirror 23. Subsequently, the circular laser beam CLB strikes the third reflective surface 25a around the second passage hole 25b, is reflected in a direction perpendicular to the optical axis of the laser light source 21, and is emitted from the unit 22.

When the cone angle $\theta A$ of the first reflective surface 24a is larger than the cone angle $\theta B$ of the second reflective surface 23a, the diameter dimension of the circular laser beam CLB is reduced as the circular laser beam CLB is propagated as shown in FIG. 1. In the circular laser beam CLB, since the first reflective surface 24a and the second reflective surface 23a have a conical shape, the wavefront WF has a truncated conical shape. The circular laser beam CLB is propagated at the angle (convergence angle) $\alpha n$ between the normal line of the wavefront WF and the central axis CA.

In the plurality of circular laser beams CLB, the outer diameter dimension Ri and the convergence angle $α_n$ are larger as being closer to the diffractive optical element 30. Thus, the plurality of circular laser beams CLB is propagated while the optical axes coincide with each other, such that an (n+1)-th circular laser beam CLB surrounds the n-th laser beam.

The plurality of circular laser beams CLB is incident on the diffractive optical element 30 at positions where outer peripheral edges and inner peripheral edges of the plurality of circular laser beams CLB coincide with and overlap each other. The local incidence angles $α_n$ of the plurality of circular laser beams CLB are different from each other.

The plurality of circular laser beams CLB are diffracted by the diffractive optical element 30, and the m-th order (for example, first order) diffracted light DL is reflected at the local diffraction angle $β$. The diffracted light DL has a circular shape, and the wavefront WFDL has a truncated conical shape. The diffracted light DL is propagated at an angle (divergence angle) between the normal line of the wavefront WFDL and the central axis CA. This divergence angle is equal to the local diffraction angle $β$.

Here, as shown in the above equation (3), the local diffraction angle $β$ depends on the local incidence angle $α_n$ and the wavelength $λ_n$ of the circular laser beam CLB. Thus, the wavelength $λ_n$ of the plurality of circular laser beams CLB having mutually different local incidence angles $α_n$ is determined, such that the local diffraction angles $β$ of the diffracted light DL of the circular laser beams CLB coincide with each other. Therefore, a difference in the local incidence angles $α_n$ of the plurality of circular laser beams CLB is canceled out by the diffractive optical element 30. Thus, the plurality of beams of diffracted light DL is emitted from the diffractive optical element 30 at the equal local diffraction angle $β$. As a result, the plurality of beams of diffracted light DL is combined into a single synthetic laser beam SLB that is coaxial, overlaps, has the identical local diffraction angle $β$, and has the equal inclination of the wavefront WFDL.

The synthetic laser beam SLB is magnified by the incident side plano-convex lens 41 of the magnifying optical system 40, and adjusted to a collimated state by the emission side plano-convex lens 42. Subsequently, the synthetic laser beam SLB is incident on the condensing optical system 50 and is condensed. Since the divergence angles $β$ of the plurality of beams of diffracted light DL configuring the synthetic laser beam SLB are equal to each other, focal positions F of the plurality of diffracted lights DL coincide with each other. As a result, a condensing diameter of the synthetic laser beam SLB can be reduced, and an irradiation power density of the synthetic laser beam SLB can be enhanced.

Here, the diameter dimension of the synthetic laser beam SLB incident on the condensing optical system 50 is increased by the magnifying optical system 40. Thus, light condensing performance of the synthetic laser beam SLB condensed by the condensing optical system 50 is enhanced, and the irradiation power density of the synthetic laser beam SLB can be further improved.

Further, when the local incidence angles $α_n$ of the plurality of circular laser beams CLB are set at equal intervals, the wavelengths $λ_n$ of the plurality of circular laser beams CLB can be also set at equal or substantially equal intervals as shown in the above equation (3). This simplifies the configuration of the laser beam combining device 10.

(Light Condensing Performance of Synthetic Laser Beam)

Figure 5:
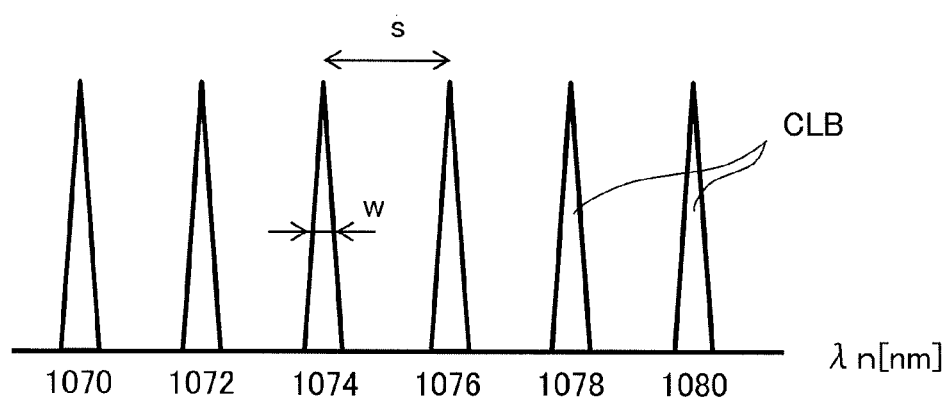
FIG. 5 is a diagram schematically showing six circular laser beams used for evaluation of light condensing performance of the laser beam combining device of FIG. 1.

Six circular laser beams CLB having wavelength characteristics as shown in FIG. 5 were emitted from the emission optical system 20, and the light condensing performance of the synthetic laser beam SLB was examined. In the circular laser beams CLB, an interval s of the center wavelength $λ_n$ was set to 2 nm, and the wavelengths $λ_n$ were set to 1,070 nm, 1,072 nm, 1,074 nm, 1,076 nm, 1,078 nm, and 1,080 nm. The intensity distribution of the synthetic laser beam SLB at a position 1 km from the condensing optical system 50 was simulated based on wave optics.

Figure 6B:
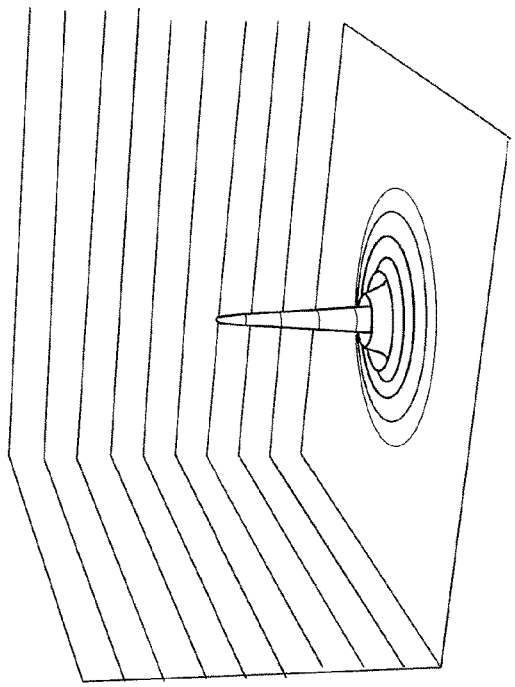
FIGS. 6B to 6D are graphs showing intensity of the synthetic laser beam condensed by the laser beam combining device of FIG. 1.
Figure 6D:
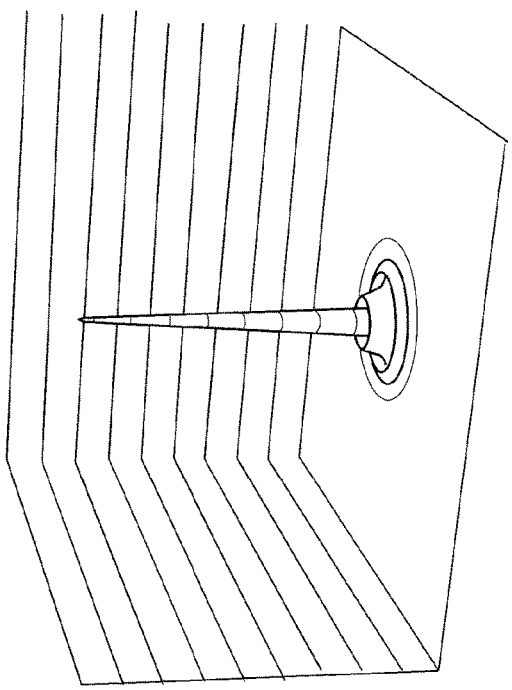
Figure 6A:
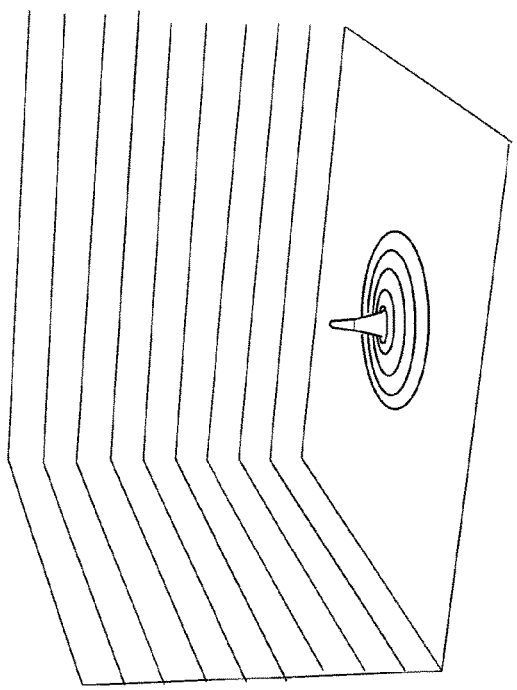
FIG. 6A is a graph showing intensity of a synthetic laser beam condensed by a conventional laser beam combining device.

As a result, as shown in FIG. 6A, in a conventional laser beam combining device that does not use the concentric diffractive optical element 30, the focal positions of the plurality of circular laser beams CLB do not match, and the intensity of the synthetic laser beam SLB was low. In contrast, as shown in FIG. 6B, in the laser beam combining device 10 according to this embodiment using the circular laser beam CLB having a line width w (FIG. 5) of 3 nm, the intensity of the synthetic laser beam SLB was increased 2.8 times compared with the conventional synthetic laser beam.

Figure 6C:
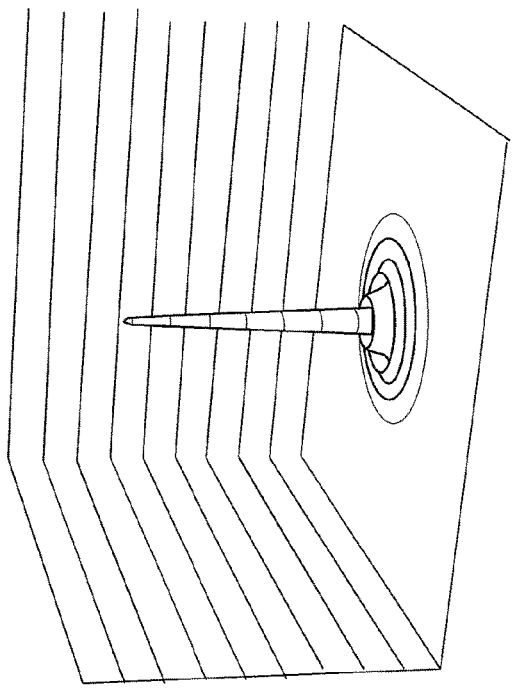

Further, as shown in FIG. 6C, in the laser beam combining device 10 according to this embodiment using the circular laser beam CLB having a line width w (FIG. 5) of 1 nm, the intensity of the synthetic laser beam SLB was increased 4.3 times compared with the conventional synthetic laser beam. Further, as shown in FIG. 6D, in the laser beam combining device 10 according to this embodiment using the circular laser beam CLB having a line width w (FIG. 5) of 0.3 nm, the intensity of the synthetic laser beam SLB was increased 4.9 times compared with the conventional synthetic laser beam.

In this way, by using the concentric diffractive optical element 30, the synthetic laser beam SLB with a high intensity even in a wide band in which the line width is about the center wavelength interval can be obtained.

(Modification)

Figure 7:
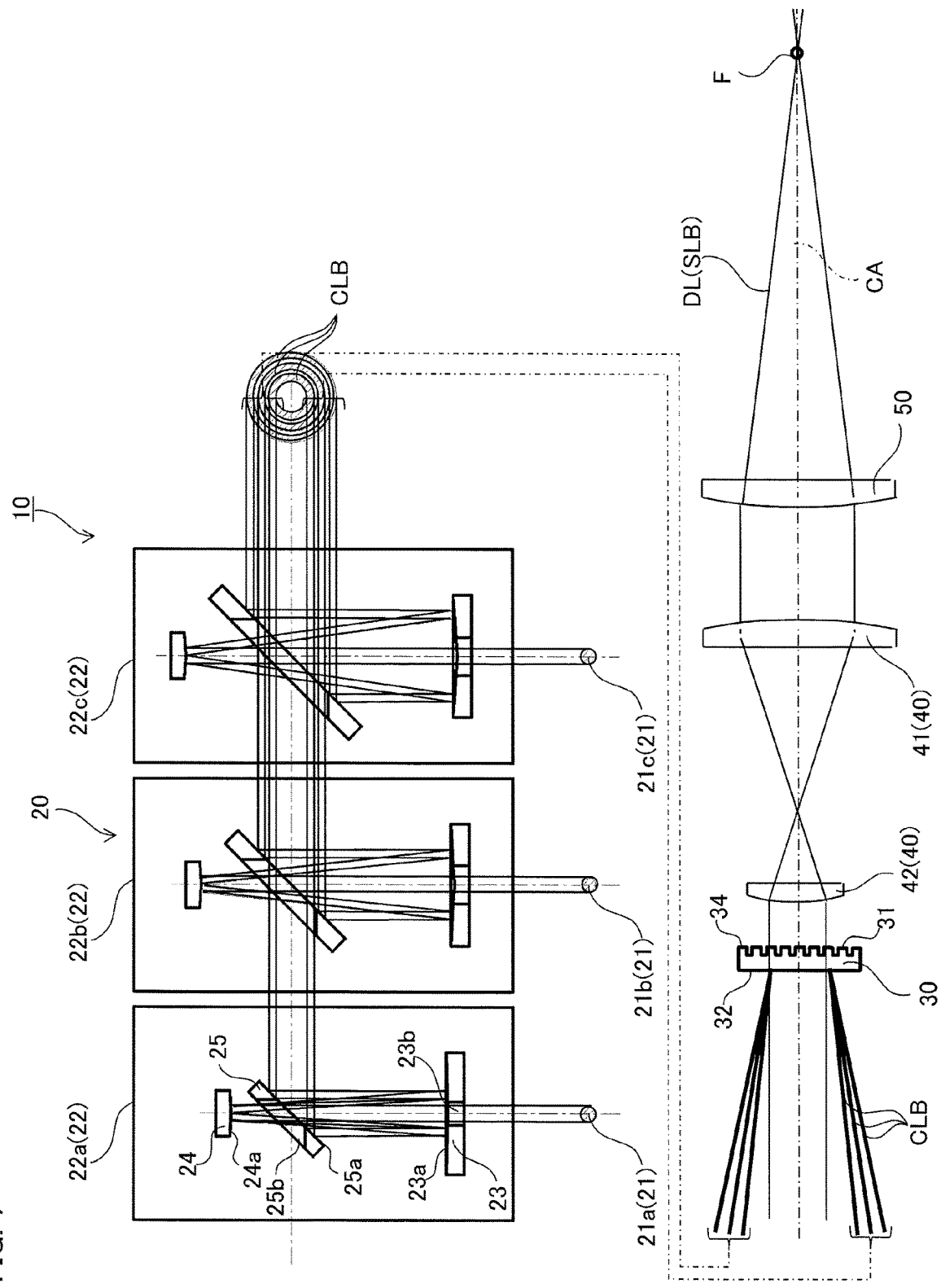
FIG. 7 is a configuration diagram schematically showing a laser beam combining device according to a modification of an embodiment of the present invention.

In the above configuration, the laser beam combining device 10 uses the reflective diffractive optical element 30, but may also use a transmissive diffractive optical element 30. In this case, as shown in FIG. 7, the incidence surface 32 of the transmissive diffractive optical element 30 is flat, and the plurality of concentric annular regions 31 divided by the plurality of steps is formed on the emission surface 34.

In this laser beam combining device 10, the plurality of circular laser beams CLB emitted from the emission optical system 20 are incident on the transmissive diffractive optical element 30. Here, the plurality of circular laser beams CLB pass through the diffractive optical element 30 and are diffracted at the emission surface 34. By this diffraction, the plurality of circular laser beams CLB incident at mutually different local incidence angles $α_n$ are diffracted according to the wavelength $λ_n$, such that the local diffraction angles $β$ of the diffracted light DL coincide with each other. Therefore, the diffracted light DL is emitted from the diffractive optical element 30 at the same local diffraction angle $β$ and combined into the synthetic laser beam SLB. The synthetic laser beam SLB is magnified by the magnifying optical system 40 and then condensed by the condensing optical system 50.

Other Embodiments

In the above configuration, the step is formed by the groove 33 on the reflective surface (incidence surface) 32 or the emission surface 34 of the diffractive optical element 30, and each surface 32 and 34 is divided into the plurality of annular regions 31 by the step. However, the shape of the diffractive optical element 30 is not limited to the above as long as the annular region 31 is concentric. For example, the diffractive optical element 30 is not provided with the step formed by the groove 33, and may have a planar shape. In this case, the diffractive optical element 30 is provided with the annular region having a specific refractive index.

In the above configuration, the circular laser beams CLB emitted from the emission optical system 20 have mutually different decrements in outer diameter dimension per unit propagation distance. However, as the concentric circular laser beams CLB may approach and overlap each other as being propagated. Thus, the amounts of change in the outer diameter dimension per unit propagation distance are only required to be different from each other. For example, the amount of change may be an increment instead of a decrement.

In the above configuration, the unit 22 uses a reflection optical system including the pair of axicon mirrors 23 and 24. On the other hand, the unit 22 may use a transmission optical system including a pair of axicon lenses.

In the above configuration, the emission optical system 20 that shapes the solid laser beam into the circular laser beam CLB for emission is used. However, the configuration of the emission optical system 20 is not limited to this configuration. For example, a scraper mirror can be used as the emission optical system 20 instead of a pair of axicon optical systems.

In the above configuration, immediately after being emitted from the emission optical system 20, the circular laser beam CLB surrounds the adjacent circular laser beams CLB. However, the adjacent circular laser beams CLB may overlap with each other.

In the above configuration, all the laser beams configuring the synthetic laser beam SLB have a circular shape. However, the laser beam having the smallest diameter among the laser beams configuring the synthetic laser beam SLB may be solid.

Further, all the above embodiments may be combined with each other as long as the embodiments do not exclude each other. For example, the examples of the other embodiments can be applied to the laser beam combining device 10 of the modification.

From the above description, many modifications and other embodiments of the present invention are apparent to a person skilled in the art. Therefore, the above description should be construed as illustrative only and is provided for the purpose of teaching a person skilled in the art the best mode of carrying out the present invention. The details of the structure and/or function can be substantially changed without departing from the spirit of the present invention.

INDUSTRIAL APPLICABILITY

The laser beam combining device according to the present invention is useful as the laser beam combining device or the like that improves the irradiation power density of the synthetic laser beam.

REFERENCE SIGNS LIST 10 laser beam combining device
20 emission optical system
30 diffractive optical element
31 annular region
32 reflective surface (incidence surface)
34 emission surface
40 magnifying optical system
50 condensing optical system
SLB synthetic laser beam
DL diffracted light
CLB circular laser beam

The invention claimed is:

1. A laser beam synthesizing device comprising:
an emission optical system that emits annular laser beams that are propagated coaxially and have mutually different wavelengths; and
a diffractive optical element that is concentric, diffracts the annular laser beams, and is arranged at a position where outer peripheral edges and inner peripheral edges of the annular laser beams coincide with and overlap each other,
wherein each of wavefronts of the annular laser beams is continuous in a circular shape; and
wherein the diffractive optical element diffracts the annular laser beams in accordance with the wavelengths of the annular laser beams, such that local diffraction angles of diffracted light of the annular laser beams incident at mutually different local incidence angles are equal to each other, and the diffractive optical element emits the diffracted light having a circular shape.

2. The laser beam synthesizing device according to claim 1, wherein the diffractive optical element has an incidence surface or an emission surface on which annular regions that are concentric and divided by a plurality of steps are formed.

3. The laser beam synthesizing device according to claim 2, wherein when the diffractive optical element is reflective, an equation:

$$m \cdot \lambda n = 2d \cdot \sin[(\alpha n - \alpha c)/2 + \theta bl] \cdot \cos[(\alpha n + \alpha c)/2 - \theta bl] \text{ is satisfied,}$$

where $\lambda n$ represents each of the wavelengths of the annular laser beams,
$\alpha n$ represents a local incidence angle of the annular laser beams to the diffractive optical element,
d represents a distance dimension of each of the annular regions of the diffractive optical element,
$\theta bl$ represents a blaze angle that is an inclination of each of the annular regions,
m represents a diffraction order,
n represents a natural number allocated for each of the annular laser beams (n=1, 2, ... N),
N represents a number of the annular laser beams emitted from the emission optical system, and
c represents an n-value of a representative of the annular laser beams and is any value of (n=1, 2, ... N).

4. The laser beam synthesizing device according to claim 2, further comprising:
a condensing optical system that condenses the diffracted light of the annular laser beams; and
a magnifying optical system that magnifies the diffracted light of the annular laser beams between the diffractive optical element and the condensing optical system.

5. The laser beam synthesizing device according to claim 2, further comprising:
a condensing optical system that condenses the diffracted light of the annular laser beams; and
a magnifying optical system that magnifies the diffracted light of the annular laser beams between the diffractive optical element and the condensing optical system.

6. The laser beam synthesizing device according to claim 1, further comprising:
- a condensing optical system that condenses the diffracted light of the annular laser beams; and
- a magnifying optical system that magnifies the diffracted light of the annular laser beams between the diffractive optical element and the condensing optical system.

7. The laser beam synthesizing device according to claim 1, further comprising:
- a condensing optical system that condenses the diffracted light of the annular laser beams; and
- a magnifying optical system that magnifies the diffracted light of the annular laser beams between the diffractive optical element and the condensing optical system.

8. A method comprising:
- emitting, by an emission optical system, annular laser beams that are propagated coaxially and have mutually different wavelengths; and
- diffracting the annular laser beams with a diffractive optical element that is concentric, wherein the diffractive optical element is arranged at a position where outer peripheral edges and inner peripheral edges of the plurality of annular laser beams coincide with and overlap each other,
- wherein each of wavefronts of the annular laser beams is continuous in a circular shape; and
- wherein the diffractive optical element diffracts the annular laser beams in accordance with the wavelengths of the annular laser beams, such that local diffraction angles of diffracted light of the annular laser beams incident at mutually different local incidence angles are equal to each other, and the diffractive optical element emits the diffracted light having a circular shape.

9. The method of claim 8, wherein when the diffractive optical element is reflective, an equation:

$m \cdot \lambda n = 2d \cdot \sin[(\alpha n - \alpha c)/2 + \theta bl] \cdot \cos[(\alpha n + \alpha c)/2 - \theta bl]$ is satisfied, where $\lambda n$ represents each of the wavelengths of the annular laser beams,
$\alpha n$ represents a local incidence angle of the annular laser beams to the diffractive optical element;
d represents a distance dimension of each of the annular regions of the diffractive optical element,
$\theta bl$ represents a blaze angle that is an inclination of each of the annular regions,
m represents a diffraction order;
n represents a natural number allocated for each of the annular laser beams (n=1, 2, . . . N),
N represents a number of the annular laser beams emitted from the emission optical system, and
c represents an n-value of a representative of the annular laser beams and is any value of (n=1, 2, . . . N).

10. The method of claim 8, further comprising:
condensing the diffracted light of the annular laser beams with a condensing optical system; and
magnifying, with a magnifying optical system, the diffracted light of the annular laser beams between the diffractive optical element and the condensing optical system.

11. A laser beam synthesizing device comprising:
- an emission optical system that emits annular laser beams that are propagated coaxially and have mutually different wavelengths; and
- means for diffracting that is concentric, diffracts the annular laser beams, and is arranged at a position where outer peripheral edges and inner peripheral edges of the annular laser beams coincide with and overlap each other,
- wherein each of wavefronts of the annular laser beams is continuous in a circular shape; and
- wherein the means for diffracting diffracts the annular laser beams in accordance with the wavelengths of the annular laser beams, such that local diffraction angles of diffracted light of the annular laser beams incident at mutually different local incidence angles are equal to each other, and the means for diffracting emits the diffracted light having a circular shape.

12. The laser beam synthesizing device according to claim 11, wherein the means for diffracting has an incidence surface or an emission surface on which annular regions that are concentric and divided by a plurality of steps are formed.

13. The laser beam synthesizing device according to claim 12, wherein when the means for diffracting is reflective, an equation:

$m \cdot \lambda n = 2d \cdot \sin[(\alpha n - \alpha c)/2 + \theta bl] \cdot \cos[(\alpha n + \alpha c)/2 - \theta bl]$ is satisfied, where $\lambda n$ represents each of the wavelengths of the annular laser beams,
$\alpha n$ represents a local incidence angle of the annular circular laser beams to the means for diffracting,
d represents a distance dimension of each of the annular regions of the means for diffracting,
$\theta bl$ represents a blaze angle that is an inclination of each of the annular regions,
m represents a diffraction order,
n represents a natural number allocated for each of the annular laser beams (n=1, 2, . . . N),
N represents a number of the annular laser beams emitted from the emission optical system, and
c represents an n-value of a representative of the annular laser beams and is any value of (n=1, 2, . . . N).

14. The laser beam synthesizing device according to claim 11, further comprising:
- a condensing optical system that condenses the diffracted light of the annular laser beams; and
- a magnifying optical system that magnifies the diffracted light of the annular laser beams between the means for diffracting and the condensing optical system.

* * * * *